(12) United States Patent
Koh et al.

(10) Patent No.: US 7,564,359 B2
(45) Date of Patent: Jul. 21, 2009

(54) MEMORY MODULE AND CARD WITH INTEGRATED RFID TAG

(75) Inventors: Wei H. Koh, Irvine, CA (US); John Ho, Trabuco Canyon, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 462 days.

(21) Appl. No.: 11/416,445

(22) Filed: May 3, 2006

(65) Prior Publication Data

US 2007/0257802 A1 Nov. 8, 2007

(51) Int. Cl.
G08B 13/14 (2006.01)

(52) U.S. Cl. .............. 340/572.8; 340/572.1; 340/572.7; 235/492

(58) Field of Classification Search .............. 340/572.8, 340/572.7, 572.1; 235/492, 486; 342/44, 342/51, 42; 343/872, 873; 713/189, 150, 713/192, 193
See application file for complete search history.

(56) References Cited

U.S. PATENT DOCUMENTS

| | | | | |
|---|---|---|---|---|
| 5,528,222 A | * | 6/1996 | Moskowitz et al. | 340/572.7 |
| 6,100,804 A | * | 8/2000 | Brady et al. | 340/572.7 |
| 7,137,011 B1 | * | 11/2006 | Harari et al. | 713/189 |
| 7,278,583 B2 | * | 10/2007 | Lee | 235/492 |
| 2004/0229696 A1 | * | 11/2004 | Beck | 463/40 |

\* cited by examiner

*Primary Examiner*—Anh V La
(74) *Attorney, Agent, or Firm*—Morland C. Fischer

(57) ABSTRACT

A dual in-line memory module (DIMM) and a digital flash card are disclosed including an internal, built-in RFID tag in which identification and product information is contained. The RFID tag has an RF integrated circuit chip and antenna traces spreading outwardly therefrom to permit access to the information contained by the RF chip. In the case of a DIMM, the RF integrated circuit chip and its antenna traces are located on top of or between the layers of a multi-layer laminated printed wiring board substrate. In the case of a digital flash card, the RF integrated circuit chip and its antenna traces are preferably located on top of a multi-layer printed wiring board substrate and then encapsulated within a molded cover. In the alternative, the RF chip and its antenna traces are attached to the inside of a cover that extends over and is spaced above the printed wiring board substrate.

7 Claims, 2 Drawing Sheets

MEMORY MODULE AND CARD WITH INTEGRATED RFID TAG

BACKGROUND OF THE INVENTION

1. Field of the Invention

This invention relates to digital memory modules and cards having volatile and non-volatile memory with an RF integrated circuit chip and an associated UHF antenna built in to establish an internal RFID tag at which to access product information stored in the chip.

2. Background Art

Some memory devices, such as digital flash cards, contain non-volatile flash memory integrated circuits that are mounted on a substrate and enclosed by a plastic cover. Other memory devices, including memory modules, contain volatile memory such as dynamic random access memory integrated circuits (DRAMs) that are mounted on a printed wiring board (PWB) substrate. This assembly is often referred to as a dual in-line memory module (DIMM). A flash card must be thin enough to be inserted into the narrow slot in a portable flash card reader. Similarly, a DIMM module must be thin enough to fit into a socket on a DIMM motherboard.

The aforementioned memory devices are now capable of very high memory capacity (e.g., exceeding 1 gigabyte) for storing digital information. In fact, some memory integrated circuits can store 4 or 16 gigabits in the case of flash and 1 gigabit in the case of DRAM. Such memory integrated circuits having large internal memory capacity are very expensive to manufacture. Accordingly, a card or module containing these same integrated circuits will be correspondingly expensive in the marketplace and, consequently, subject to theft and counterfeiting.

During manufacture of these expensive and valuable digital flash cards and DIMM modules, it is necessary to keep track of the work-in-progress throughout the production and distribution process of each memory product. Once an individual memory product is manufactured, tracking is also required of the subsequent inspection, testing and shipping. The current manner of identification and tracking typically involves using a bar code label and a complementary bar code reader to identify the product work order and/or a product identification number.

External RFID labels are becoming increasingly popular for identifying and tracking a variety of products in substitution of the conventional bar code labeling and reading techniques. Such an RFID label, which commonly includes an RF chip and a printed antenna, is applied to the exterior of the product to be tracked or its shipping package or container. However, it is known that the external RFID label may become separated or peeled away from the exterior of a product or its package, whereby the information contained by the RF chip will be lost.

It would therefore be desirable in the case of digital flash cards and DIMM modules to have a built-in (i.e., internal) or integrated RFID tag so that the tag and the information stored therein cannot be easily altered or removed and lost.

SUMMARY OF THE INVENTION

Disclosed herein is a DIMM (dual in-line memory module) and a flash memory (e.g., SD, MMC, CF, PC) card including a printed wiring board (PWB) which is preferably a multi-layer laminated rigid glass-epoxy substrate. According to a first embodiment, DRAM memory devices and a controller are interconnected to contact pad patterns on the top surface of the substrate. Ground, power and data signals are provided to the DRAMs by way of the signal traces on top of the substrate. An RF integrated circuit chip containing product information is mounted on top of the substrate (or between the layers thereof) and UHF antenna traces spread outwardly from the chip without interfering with the contact patterns. The assembled substrate is then used as a surface mount assembly during fabrication of a DIMM module.

According to a second embodiment, the PWB is used for a digital flash card. In this case, a flash memory package and its controller are mounted on top of the multi-layer laminated substrate of the PWB. An RF integrated circuit chip containing product information is also mounted on top of the substrate (or between the layers thereof), and UHF antenna traces spread outwardly therefrom. A top cover may be molded over the substrate such that all of the intermediate spaces are filled in between the components on the flash card. In the alternative, a cover may be spaced above and extend over the top of the substrate with the RF chip and its antenna traces being attached at the underside of the cover. In either event, the internal RF chip and its antenna traces are located in a tamper-proof environment to protect against possible damage and counterfeiting.

The built-in RF integrated circuit chip may contain important identification, quality control and inventory control information about the memory module or memory card on which it is located. Accordingly, an integrated RFID tag is provided which is unlikely to be accidentally or intentionally removed during the life of the memory product on which it is carried so that the product information stored therein will not be altered or separated from the product.

DESCRIPTION OF THE PREFERRED EMBODIMENT

Figure 1:
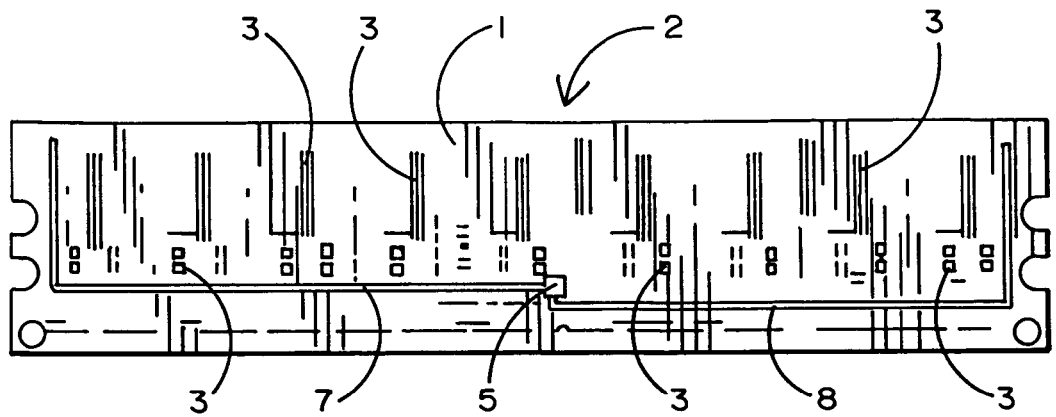
FIG. 1 shows the top of the substrate of a printed wiring board for a DIMM memory module having top layer DRAM contact pad patterns with a built-in RF integrated circuit chip and UHF antenna traces mounted on the substrate according to a first preferred embodiment of this invention.

Referring to FIG. 1 of the drawings, there is shown a laminated substrate 1 of a conventional printed wiring board (PWB) 2 having contact pad patterns 3 located across the top surface thereof to provide solder joint interconnects for active DRAM memory devices and a controller (not shown). The PWB substrate is preferably a multi-layer rigid glass-epoxy FR4 laminate. Signal traces (also not shown), which provide connections to ground, power and data sources are typically formed from copper and extend on or through the substrate 1. According to a first embodiment of the present improvement, an RF integrated circuit chip 5 is mounted on top of the substrate 1 of PWB 2, and antenna traces 7 and 8 extend therefrom to the outer surface of the substrate 1 without interfering with the contact pad patterns 3. For the purposes of this invention, the RF integrated circuit chip 5 is preferably a passive device that requires no power, and the antenna traces 7 and 8 permit UHF transmission greater than 300 MHz. However, lower frequency antennas are also within the scope of this invention. By way of example only, a commercially available RF integrated circuit chip that may be used herein is a 0.4×0.4 mm "µ-chip" manufactured by Hitachi Ltd.

Figure 1A:
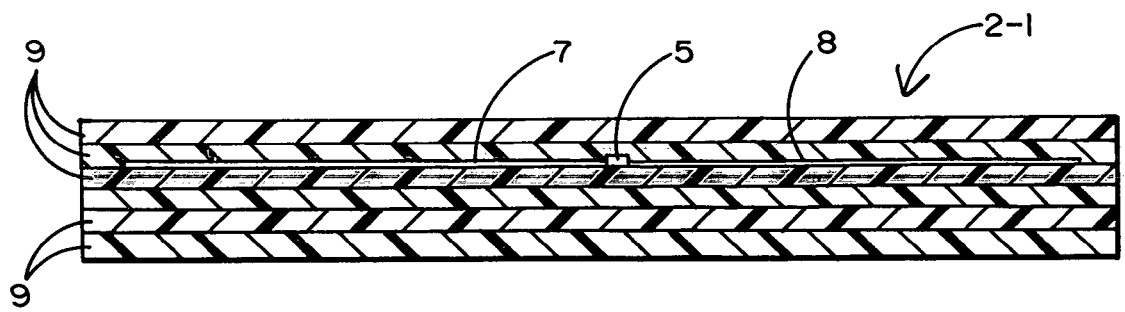
FIG. 1A shows a multi-layer printed wiring board for a DIMM with the RF chip and the antenna traces embedded between the layers thereof.

The antenna traces 7 and 8 can be formed by means of conventional conductive ink or photo-etching or deposition techniques during manufacture of the substrate 1. The antenna traces 7 and 8 can have a variety of different shapes (e.g., straight, bent or looped), lengths and locations so as to lay upon the substrate 1 and be suitable for a particular form factor. As illustrated in FIG. 1A, it is also within the scope of this invention for the RF chip 5 and its antenna traces 7 and 8 to be embedded between the layers 9 of a laminated multi-layer (e.g., rigid glass epoxy) PWB 2-1. The completed PWB 2-1 may then be used in a common surface mount assembly during the fabrication of a DIMM module.

Figure 2:
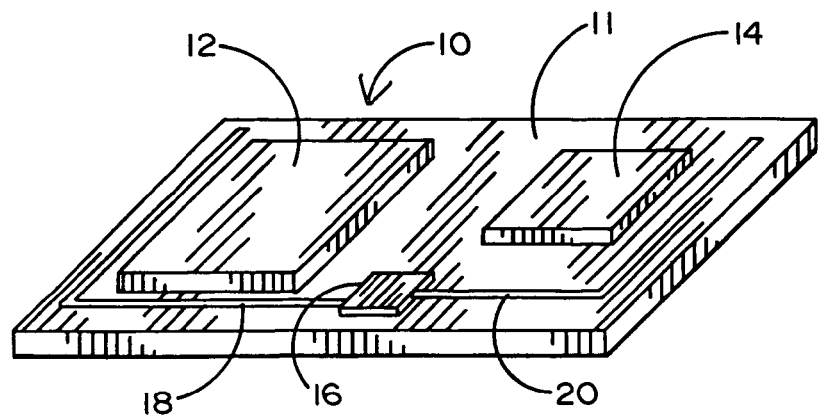
FIG. 2 shows the top of the substrate of a printed wiring board assembly for a digital flash card having a flash memory package and controller with a built-in RF integrated circuit chip and antenna traces mounted on the substrate according to a second preferred embodiment of this invention.
Figure 2A:
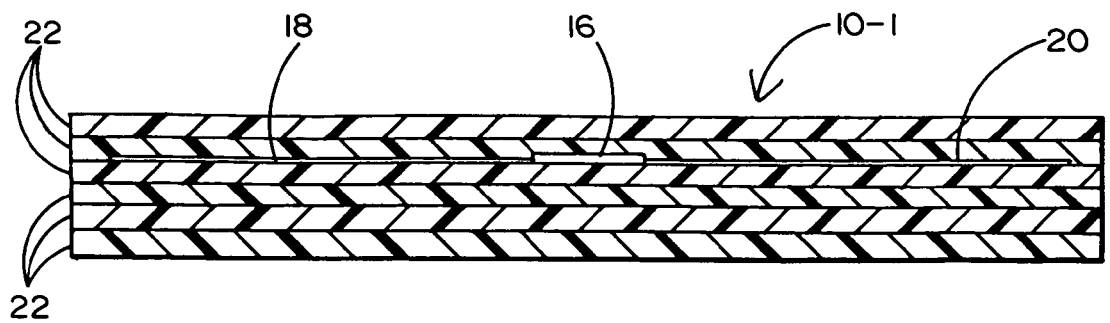
FIG. 2A shows a multi-layer printed wiring board for a digital flash card with the RF chip and the antenna traces embedded between the layers thereof.

Turning now to FIG. 2 of the drawings, a printed wiring board assembly (PWA) is shown for a digital flash card 10. Mounted on the top of a laminated PWB substrate 11 of the flash card 10 are the usual flash memory package 12 and its controller 14. According to a second embodiment of the present improvement, an RF integrated circuit chip 16 is also mounted on the top of the PWB substrate 11. As in the case of FIG. 1, antenna traces 18 and 20 spread outwardly along the top surface of substrate 11 from RF chip 14 without interfering with the existing circuit patterns (not shown) for the flash and controller signal pads. As was also the case in FIG. 1A, and as is best shown in FIG. 2A, the PWB 10-1 may be a multi-layer rigid glass-epoxy laminate, and the RF integrated circuit chip 16 and the UHF antenna traces 18 and 20 may be embedded between the layers 22 of the PWB 10-1 rather than being mounted on the top surface thereof.

Figure 3:
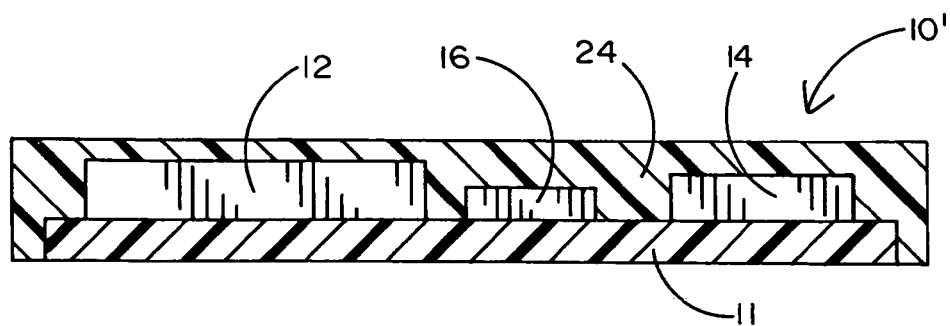
FIG. 3 is a cross-section of the digital flash card of FIG. 2 with the printed wiring board assembly, including the internal RF integrated circuit chip and antenna traces, encapsulated within a molded top cover.

In addition to the flash memory package 12, its controller 14, and the RF integrated circuit chip 16 and antenna traces 18 and 20, all mounted on the top of the PWB substrate 11 of a digital flash card 10 in the manner shown in FIG. 2, FIG. 3 of the drawings shows a top cover 24 molded over the PWA assembly so as to fill in all of the intermediate spaces, whereby the components are encapsulated therewithin. The resulting molded flash card 10' of FIG. 3 includes UHF antenna traces (not shown) located on the top surface of the substrate surface 11 (or between interior layers of the substrate) as was previously disclosed when referring to FIG. 2.

Each of FIGS. 1-3 provides examples of integral RF components mounted on the top surfaces of the substrates 1 and 11 of a PWB. In the alternative, the RF components shown in FIGS. 1-3 can also be mounted on other surfaces of a memory card, such as on the inside of a cover used for MMC (multimedia), SD (secure digital), CF and PC cards, and the like. However, the size of the card may change depending upon its application.

Figure 4:
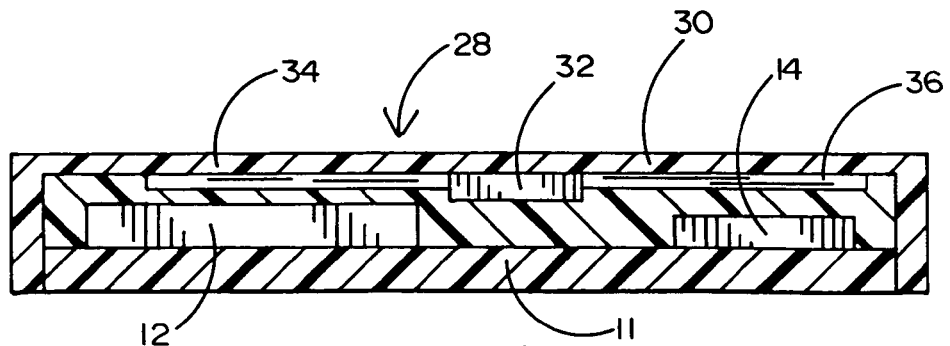
FIG. 4 shows the digital flash card of FIG. 2 with the built-in RF integrated circuit chip and antenna traces attached to the inside of a card cover.

Referring in this regard to FIG. 4 of the drawings, a flash memory card 28 is shown with the usual flash memory package 12 and controller 14 mounted on top of the substrate 11. In this case, a cover 30 is spaced above and surrounds the memory package 12 and its controller 14. An RF integrated circuit chip 32 having a pair of UHF antenna traces 34 and 36 extending outwardly and in opposite directions therefrom are attached at the underside of the card cover 30.

With the cover 30 assembled to the substrate 11, a sealed card 28 is formed having an enclosed printed wiring board assembly. The built-in RF chip 32 and the antenna traces 34 and 36 will be located inside the cover 30, while the card is able to maintain its original form factor. By virtue of the foregoing, the internal RF integrated circuit chip 32 is integrated with the card 28 so as to be protected against damage and tampering. In this same regard, the tamper-proof card 28 is protected against being counterfeited and replaced by a potentially inferior and cheaper card as might be attempted on memory products of high monetary value.

An internal RFID tag having an RF integrated circuit chip has been disclosed herein which provides the advantages of being able to accurately identify the memory product (i.e., module or card) with which it is combined while enabling manufacturers and distributors to be provided with vital quality control and inventory control information about the product should it be returned by a user. By integrating the RFID tag into the memory module or card, the more easily removable and commonly used external RFID labels are avoided so that critical product information will be preserved and stay with the product throughout its life.

The invention claimed is:

1. A digital memory module having an internal RFID rag, and comprising:
    a multi-layer laminated substrate having a plurality of layers arranged face-to-face one another and including Dynamic Random Access Memory contact patterns surface mounted on said substrate to which DRAM memory devices are to be interconnected to receive ground, power and data signals;
    an RF integrated circuit chip carried by said multi-layer laminated substrate and containing information concerning the identity and manufacture of the digital memory module, said chip embedded within said multi-layer laminated substrate and sandwiched between an adjacent pair of said plurality of layers thereof to prevent access to and tampering with said chip; and
    an antenna coupled to and extending outwardly from said RE integrated circuit chip by which to enable access to the information contained thereby, said antenna also embedded within said substrate.

2. The digital memory module recited in claim 1, wherein said antenna runs between the same adjacent pair of layers of said multi-layer laminated substrate between which said RF integrated circuit chip is sandwiched.

3. A digital flash card having an internal RFIID tag, and comprising:
    a printed wiring board substrate having a flash memory and a controller mounted thereon;
    an RF integrated circuit chip containing information concerning the identity and manufacture of said digital flash card;
    an antenna coupled to and extending outwardly from said RF integrated circuit chip by which to enable access to the information contained thereby; and
    a cover attached to and extending over the top of said printed wiring board substrate so as to completely surround and enclose therewithin each one of said flash memory, said controller, said RF integrated circuit chip and said antenna to prevent access thereto and tampering therewith.

4. The digital flash card recited in claim 3, wherein said cover is filled with a molding material, such that said flash memory, said controller, said RF integrated circuit chip and said antenna are all encapsulated within said molding material.

5. The digital flash card recited in claim 3, wherein said flash card has one of a MMC, SD, CF, or PC form factor.

6. A digital flash card having an internal RFID tag, and comprising:
- a multi-layer laminated substrate having a plurality of layers arranged face-to-face one another and a flash memory and a controller mounted on said substrate;
- an RF integrated circuit chip containing information concerning the identity and manufacture of said digital flash card, said chip embedded within said multi-layer laminated substrate and sandwiched between an adjacent pair of said plurality of layers thereof to prevent access to and tampering with said chip; and
- an antenna coupled to and extending outwardly from said RF integrated circuit chip by which to enable access to the information contained thereby, said antenna also embedded within said substrate.

7. The digital flash card recited in claim 6, wherein said antenna runs between the same adjacent pair of layers of said multi-layer laminated substrate between which said RF integrated chip is sandwiched.

* * * * *